United States Patent [19]

Hanson

[11] Patent Number: 4,823,026
[45] Date of Patent: Apr. 18, 1989

[54] APPARATUS AND METHOD FOR MEASUREMENT OF A SIGNAL WITH A SAMPLER

[75] Inventor: Eric R. Hanson, Monroe, N.Y.

[73] Assignee: Hypres, Inc., Elmsford, N.Y.

[21] Appl. No.: 101,509

[22] Filed: Sep. 28, 1987

[51] Int. Cl.⁴ .................... H03K 5/153; H03K 5/24
[52] U.S. Cl. .................... 307/352; 307/277; 307/306
[58] Field of Search .............. 307/352, 306, 277, 245; 357/5; 365/162

[56] References Cited

U.S. PATENT DOCUMENTS

| 3,313,956 | 4/1967 | Hillman | 307/352 |
| 4,245,169 | 1/1981 | Hamilton . | |
| 4,387,465 | 6/1983 | Becker | 307/352 |
| 4,401,900 | 8/1988 | Faris . | |
| 4,533,840 | 8/1985 | Gheewala et al. . | |
| 4,565,993 | 1/1986 | Brian | 307/352 |
| 4,638,185 | 1/1987 | Kobayashi et al. . | |

OTHER PUBLICATIONS

"Analog Measurement Applications for High-Speed Josephson Switches" Hamilton et al., Transactions on Magnetics, vol. MAG-17, No. 1. Jan. 1981 pp. 577-582.

Primary Examiner—John Zazworsky
Attorney, Agent, or Firm—Kenyon & Kenyon

[57] ABSTRACT

An apparatus and method for measurement of a signal with a monitor gate is disclosed. A signal to be measured is applied as an input to the monitor gate and a detection signal is generated that indicates whether or not the monitor gate has switched between states. A digital output is generated that corresponds to the integration of the detection signal. The output of the digital integrator is applied to a digital-to-analog converter. The output of the digital-to-analog converter is fed back to the monitor gate. A probability limit monitor and a gain control with respect to signal measurement are also disclosed.

19 Claims, 4 Drawing Sheets

APPARATUS AND METHOD FOR MEASUREMENT OF A SIGNAL WITH A SAMPLER

BACKGROUND OF THE INVENTION

The present invention relates to the field of signal sampling. In particular, this invention relates to an apparatus and method for measuring a signal with a signal sampler.

A Josephson junction sampling circuit is disclosed in U.S. Pat. No. 4,401,900 of Sadeg M. Faris (the '900 patent"). Operation of a Josephson junction sampler requires a feedback current to balance out the unknown signal current. A known signal measurement system employs a Josephson junction sampling gate, a transition or level detector, and an analog integrator in a feedback loop. One type of known Josephson junction sampler runs at a constant clock rate.

In a known signal measurement system employing analog integration, feedback gain is directly proportional to the clock period of the system, and such a direct proportionality is not desirable if the clock rate of the system is variable over a wide range of frequencies. A variable clock rate can occur, for example, if the system clock is synchronized to external signals with different clock rates. A known signal measurement system using analog integration may experience problems with a low repetition rate signal. If gain is dependent on the sampling rate, then one problem is that the gain of the analog integrator increases as the frequency of the applied signal decreases, thereby leading to problems with the feedback loop of the system. If, however, the grain of the system employing analog integration is kept constant by known methods, at low signal frequencies drift and offset in the integrator may nevertheless be a problem.

The known analog system employing analog integration thus does not have the flexibility of adapting to varying clock rates, and therefore is not a good general purpose system.

Even when clock rates are fixed, however, the known analog system does not have the characteristic of relatively rapid signal acquisition. Furthermore, in order for the known analog system to be able to send signals to a computer, an analog-to-digital converter is required, and an analog-to-digital converter is generally slower and more expensive to implement in a system than a digital-to-analog converter.

SUMMARY AND OBJECTS OF THE INVENTION

In view of the above background, one of the objects of the present invention is to provide an apparatus and a method for measuring a signal that can be used with a relatively wide range of clock frequencies.

Another object of the present invention is to provide an apparatus and method for measuring a signal that does not employ an analog-to-digital converter.

Another object of the present invention is to provide an apparatus and a method for measuring a signal that permits the rapid acquisition of data and detects a change in an input signal more rapidly.

A further object of the present invention is to provide an apparatus for measuring a signal that includes a digital integrator in a feedback loop.

Another object of the present invention is to provide a method for measuring a signal that includes digital integration.

A further object of the present invention is to provide a signal-measuring apparatus and method wherein the gain of a feedback loop automatically adjusts in a way that can shorten the time for signal acquisition.

Another object of the present invention is to provide a signal-measuring apparatus and method for estimating the envelope of a modulated high-frequency carrier signal.

A further object of the present invention is to provide a signal-measuring apparatus and method for estimating the envelope of a modulated high-frequency carrier signal even when the modulation signal is asynchronous with respect to the carrier signal.

Another object of the present invention is to provide a signal-measuring apparatus wherein the gain of the feedback integrator is different for positive and negative integration.

A further object of the present invention is to provide a signal-measuring apparatus and method wherein a feedback signal is an estimate of the minimum or maximum of both the signal and the noise being measured.

These and other objects are achieved by the present invention. The present invention may generally be summarized as a signal-measuring apparatus comprising a monitor gate switchable between at least two distinguishable states, the input signal being applied as a control signal to the monitor gate along with a sampling pulse and an analog bias signal; means for generating a detection signal that indicates whether or not the monitor gate has switched between states; means for generating a digital output that corresponds to the integration of a detection signal; means for converting the digital output of the integration means to the analog bias signal; and feedback means for applying the analog bias signal to the monitor gate.

Another aspect of the present invention is a signal-measuring apparatus that includes means for varying the magnitude of a gain of an integration means in response to the character of a sequence of detection signals.

A further aspect of the present invention is a signal-measuring apparatus that includes means for varying the magnitude of a gain of an integration means by a first amount in response to a first detection signal and by a second amount in response to a second detection signal.

Another aspect of the present invention is a signal-measuring method comprising the steps of applying the input signal to a monitor gate along with a sampling pulse and an analog bias signal, the monitor gate being switchable between at least two distinguishable states; generating a detection signal that indicates whether or not the monitor gate has switched between states; generating a digital output that corresponds to the integration of the detection signal; converting the digital output of the integration means to the analog bias signal; and applying the analog bias signal from the integration means to the monitor gate.

A further aspect of the present invention is a signal-measuring method that includes the step of varying the magnitude of a gain of an integration means in response to the character of a sequence of detection signals.

Another aspect of the present invention is a signal-measuring method that includes the step of varying the magnitude of a gain of an integration means by a first amount in response to a first detection signal and by a second amount in response to a second detection signal.

Other objects, features, and advantages of the present invention will be apparent from the accompanying drawings and from the detailed description which follows below.

BRIEF DESCRIPTION OF THE DRAWINGS

The present invention is illustrated by way of example and not limitation in the figures of the accompanying drawings, in which like references indicate similar elements, and in which.

DETAILED DESCRIPTION

Figure 1:
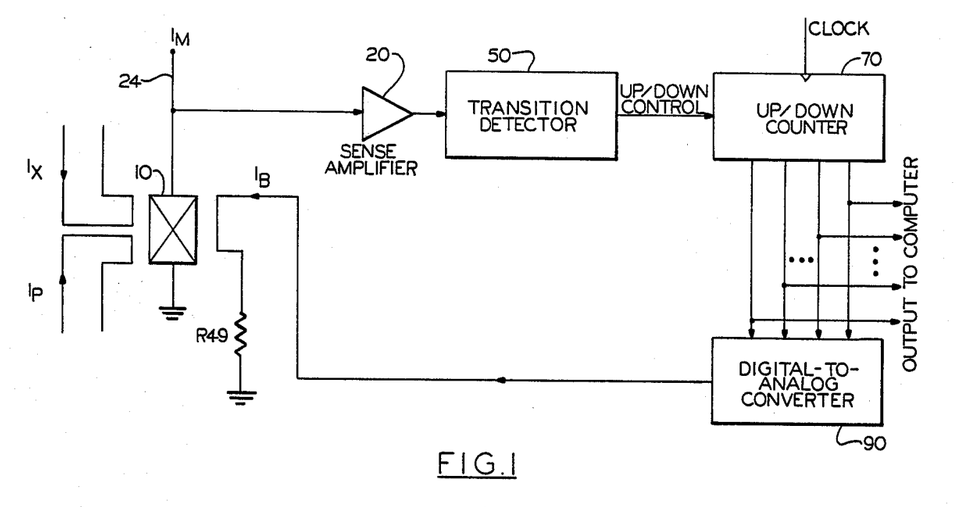
FIG. 1 is a block diagram of one embodiment of the signal-measuring apparatus according to the present invention.

With reference to the drawings, FIG. 1 illustrates in block diagram form a signal measuring apparatus which comprises a digital feedback loop for measurement of an unknown signal with a Josephson junction sampler. Monitor gate 10 in FIG. 1 is of the type described in the '900 patent, which discloses a Josephson junction sampling circuit. In the present embodiment, the monitor gate 10 is configured in way similar to that in the '900 patent. As described in the '900 patent, and equally pertinent to the present embodiment, monitor gate 10 of the present FIG. 1 can comprise a single Josephson device of very small dimensions in order to minimize resistance and capacitance. (see '900 patent at Col. 6, L. 29-31). Monitor gate 10 can also comprise a superconductive quantum interference device (SQUID) which has two distinguishable states and is sensitive to the unknown signal to be sampled. (see Id. at Col. 3, L. 62-67).

Monitor gate 10 of the present FIG. 1 responds to (1) an unknown signal Ix to be measured, (2) a sampling pulse Ip, and (3) a bias current $I_B$ ($I_B$ is also referred to as feedback current, feedback signal, or simply feedback) in order to change its voltage state. (see Id. at Col. 5, L. 36-39). Monitor gate 10 is a threshold device that will change its state when the algebraic sum of the three inputs Ix, Ip, and $I_B$ exceeds a threshold value. (see Id. at Col. 5, L. 39-41). Because the threshold is a constant amplitude, the value of the bias current will track the amplitude of the unknown signal if the amplitude of the sampling pulses is constant. (see Id. at Col. 5, L. 42-45). In that way, the unknown signal can be reconstructed in both amplitude and shape. (see Id. at Col. 5, L. 45-46).

Conductor 24 provides a constant gate current Im for monitor gate 10. Bias current $I_B$ runs to ground through resistor R49.

The digital feedback loop begins with monitor gate 10. Sense amplifier 20 and transition detector 50 determine if monitor gate 10 has switched to the voltage state. An output of transition detector 50 is an up/down control signal, which indicates whether monitor gate 10 has switched to the finite voltage state. In an alternative embodiment, a level detector is substituted for transition detector 50, the level detector having an up/down control signal as an output. The level detector of an alternative embodiment would detect whether or not the monitor gate 10 is in the finite voltage state.

The up/down control signal generated by transition detector 50 is applied to up/down counter 70. Up/down counter 70 is used as a digital integrator in the circuit of FIG. 1. A clock signal applied to the up/down counter 70 cycles the counter up or down (i.e., increments or decrements the count), depending on whether an "up" or a "down" control signal is received from transition detector 50. Whether the control signal is an "up" or a "down" for a sensed transition of monitor gate 10 to the voltage state depends on the polarities of (1) feedback current $I_B$, (2) unknown signal Ix, (3) sampling input Ip, and (4) gate current Im.

In alternative embodiments of the present invention, other types of digital integrators could be substituted for up/down counter 70 of FIG. 1. An example of another type of digital integrator would be an adder and a latch.

The rate of the clock signal that is applied to up/down counter 70 of FIG. 1 determines how many samples per second of unknown signal Ix are taken by the signal-measuring apparatus at a point in time relative to the beginning of unknown signal Ix. If the waveform of signal Ix repeats faster than the clock rate, then the signal-measuring apparatus measures multiples of every waveform rather than every waveform.

The signal-measuring apparatus remains operable and allows measurement of an unknown signal Ix for either a constant clock rate or for clock rates that vary over a wide range of frequencies, for example, from 10 Hertz to 300 Kilohertz.

Up/down counter 70 provides a binary count as a digital output. The digital output of up/down counter 70 is applied to a digital-to-analog converter 90 and thereby converted to feedback current $I_B$, an analog signal. Feedback current $I_B$, also referred to bias current $I_B$, is then provided to monitor gate 10, thereby completing the feedback loop.

The digital data on the digital output of up/down counter 70 can be applied as an input to a computer or as an input to other digital logic without the need for an analog-to-digital converter. The digital data on the digital output of up/down counter 70 provides an indication of the feedback of the digital feedback loop.

In normal operation, the feedback loop of the signal-measuring apparatus of FIG. 1 balances the switching probability of monitor gate 10 at some value. The value of switching probability for the signal-measuring apparatus is typically 50%.

For the feedback loop of the signal-measuring apparatus of FIG. 1, the gain of the feedback loop is not a function of the clock rate applied to the up/down counter, and thus the gain of the signal-measuring apparatus does not vary with varying clock rates.

Figure 2:
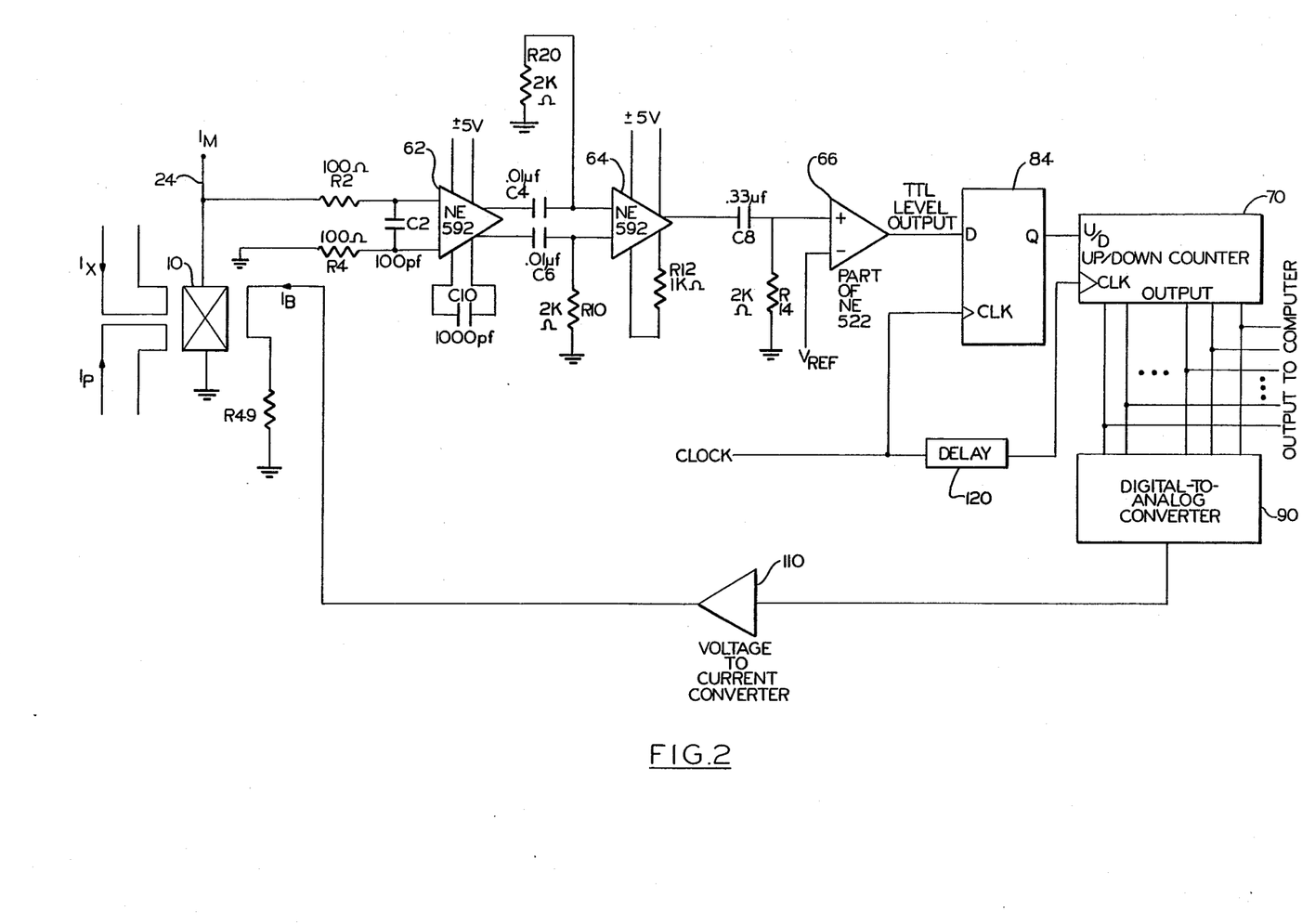
FIG. 2 is a circuit diagram of an embodiment of a signal-measuring apparatus.

FIG. 2 illustrates in schematic form the signal measuring apparatus of FIG. 1. In FIG. 2, monitor gate 10 is configured as in FIG. 1, responding to unknown signal Ix to be measured, sampling pulse Ip, and bias current $I_B$. Conductor 24 provides a constant gate current $I_m$ for monitor gate 10. Bias current $I_B$ runs to ground through resistor R49.

Differential amplifier 62, capacitor C2, and capacitor C10 are configured as a differentiator for sensing whether or not monitor gate 10 has switched to the voltage state. Differential amplifier 62 is part of integrated circuit part number NE592 of Signetics. Resistors R2 and R4 and capacitor C2 act to limit high-frequency noise.

Differential amplifier 64, resistors R10, R12, and R20, and capacitors C4 and C6 are configured as a wide band gain stage, amplifying the signals from the differentiator. Differential amplifier 64 is part of integrated circuit part number NE592 of Signetics. Capacitors C4 and C6 provide alternating current ("AC") coupling. Resistors R10 and R20 are a direct current ("DC") restore.

Operational amplifier 66, capacitor C8, and resistor R14 are configured as a threshold detector for detecting whether monitor gate 10 has switched to the voltage state. A voltage $V_{REF}$ is provided as a reference voltage to operational amplifier 66. Threshold detector 66 is part of integrated circuit part number NE522 of Signetics. Capacitor C8 provides AC coupling. Resistor R14 is a DC restore.

The output signal from operational amplifier 66 is a transistor-transistor logic ("TTL") level signal. That TTL signal is applied to the "D" input of a D-type flip-flop 84. A clock signal is applied to the clock input of flip-flop 84. The "Q" output of flip-flop 84 is an up/down control signal, and that up/down control signal is applied to the up/down input of up/down counter 70. The clock signal that is applied to the clock input of flip-flop 84 is run through a delay 120 and then applied to the clock input of up/down counter 70. Delay 120 can be comprised of logic gates.

The digital output of up/down counter 70 is applied to digital-to-analog converter 90. The analog output signal of digital-to-analog converter 90 is applied to voltage-to-current converter 110. The output signal of voltage-to-current converter 110 is feedback current $I_B$, which is applied to monitor gate 10 and which runs to ground by way of resistor R49.

Figure 3:
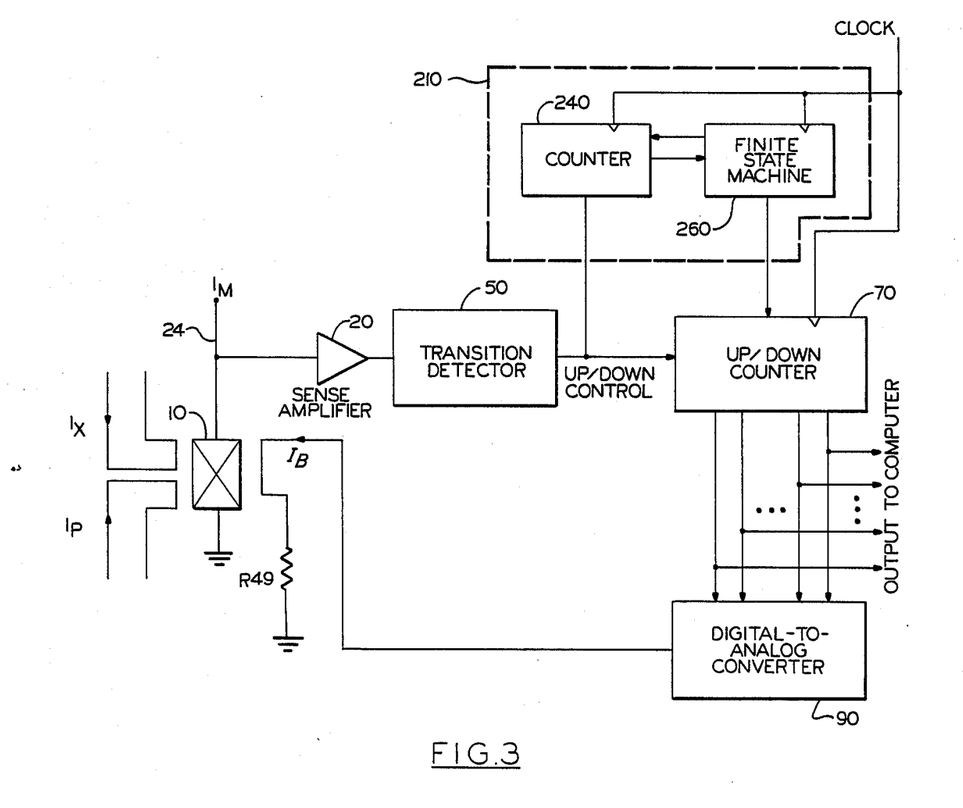
FIG. 3 is a block diagram of an embodiment of a signal-measuring apparatus with variable gain and a probability limit monitor.

FIG. 3 illustrates a signal-measuring apparatus that includes a probability limit monitor 210 for adjusting the gain of the signal-measuring apparatus.

Probability limit monitor 210 detects when there is a high probability of monitor gate 10 either switching or not switching. When such a high probability condition is detected, probability limit monitor 210 increases the gain of the signal-measuring apparatus by increasing the magnitude of the incrementing or decrementing of up/down counter 70. By increasing the gain of the signal-measuring apparatus for the high-probability condition, the time for acquisition of and determination of unknown signal $I_x$ is shortened.

When, however, the high-probability condition ends and the switching probability returns to close to the balancing point, then the gain of the signal-measuring apparatus is reduced to preserve the noise averaging properties of the feedback integrator. The gain is so reduced by decreasing the magnitude of the incrementing or decrementing of up/down counter 70.

In other words, in normal operation, the feedback loop 70, 90 of signal-measuring apparatus balances the switching probability of monitor gate 10 at some value. That value is typically near 50% switching probability. If probability limit monitor 210 detects that there is a high probability of switching or not switching, then the magnitude of the incrementing and decrementing of the up/down counter is increased. (Alternatively, the gain of another type of digital integrator used in place of up/down counter 70 is increased). This allows the feedback to bring the switching probability back to balance quickly.

Once the probability approaches balance, the incrementing and decrementing of up/down counter 70 is reduced to the normal value. (Alternatively, the gain of another type of digital integrator used in place of up/down counter 70 is reduced to a normal value).

The gain control provided by probability monitor 210 can be in discrete steps or continuously variable.

In FIG. 3, the up/down control signal from transition detector 50 is fed to counter 240, which is a 4-bit binary counter. A clock signal is applied to counter 240 and to finite state machine 260. The output of counter 240 is applied to finite state machine 260. Finite state machine 260 also sends an enable signal and a reset signal to counter 240. Finite state machine 260 is implemented in a programmable array logic ("PAL") part number 825153 of Signetics and storage elements using D-type flip-flops. Finite state machine 260 in conjunction with counter 240 performs the following function, which is programmed into the PAL and implemented using the PAL and D-type flip-flop storage elements, together with counter 240: IF in low gain and the last 16 samples were all the same, THEN switch to high gain, ELSE remain in low gain; but IF in high gain and the last 2 samples were the same, THEN remain in high gain, ELSE switch to low gain.

High gain means that the magnitude of the incrementing and decrementing of up/down counter 70 is increased. Low gain means that the magnitude of the incrementing and decrementing of up/down counter 70 returns to its normal value.

Figure 4:
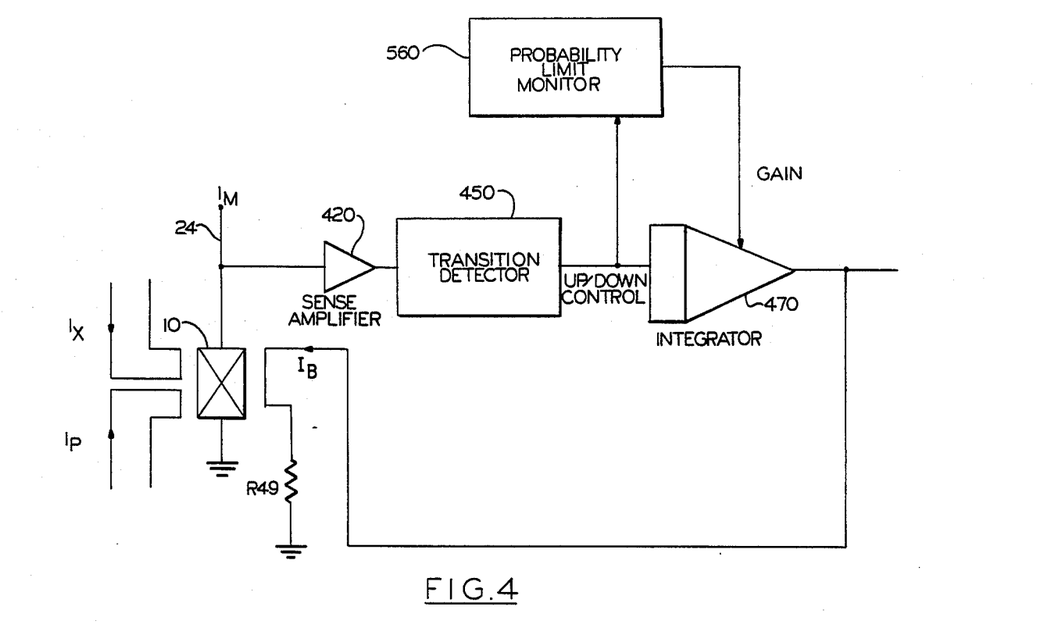
FIG. 4 is a block diagram of an alternative embodiment of a signal-measuring apparatus with variable gain and a probability limit monitor.

FIG. 4 illustrates an alternative embodiment of the present invention, which includes a probability limit monitor 560 adjusting the gain of an analog integrator 470. One example of an analog integrator is comprised of an operational amplifier and a capacitor. In FIG. 4, the up/down control signal generated by sense amplifier 420 and transition detector 450 is applied to analog integrator 470. The output of analog integrator 470 is analog feedback signal $I_B$. If probability limit monitor 560 detects that there is a high probability of switching or not switching, then the gain of analog integrator 470 is increased so that the feedback can bring the switching probability back to balance quickly. Once the probability approaches balance, the gain is reduced to the normal value.

Figure 5:
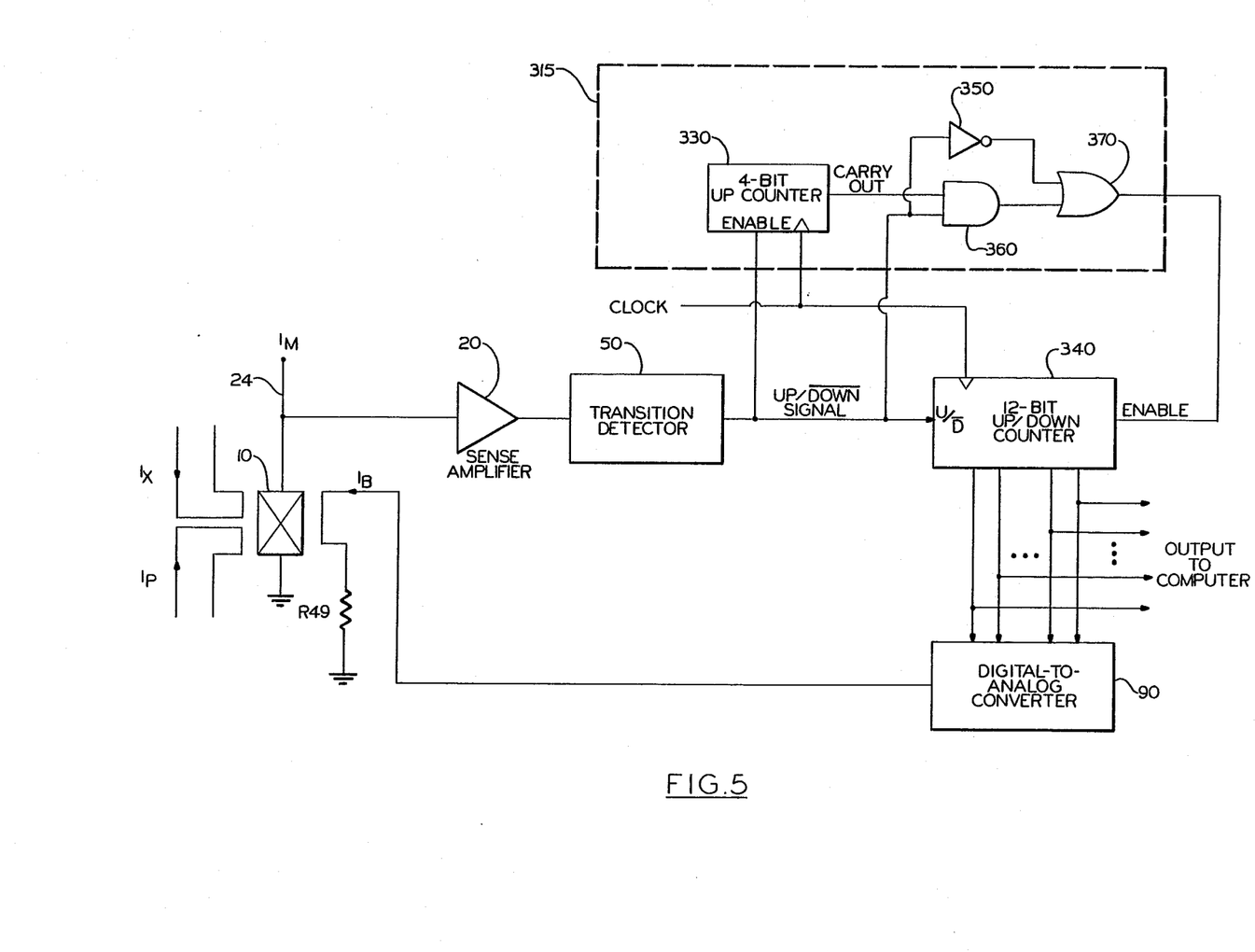
FIG. 5 is a block diagram of an embodiment of a signal-measuring apparatus with variable gain and gain control.

FIG. 5 illustrates a signal-measuring apparatus that additionally includes gain control circuitry 315 for making the gain of the feedback integrator different for positive and negative integration. In FIG. 5, the digital feedback integrator is implemented as a 12-bit up/down counter 340. The effective gain of counter 340 is changed by counting up on every 16th "up" count input, while counting down on every "down" count input. In alternative embodiments of the present invention, other types of digital integrators could be substituted for 12-bit up/down counter 340.

The signal-measuring apparatus of FIG. 1 will average a modulated carrier to zero assuming that the sampling is synchronized to the modulation but not to the carrier. But with the signal-measuring apparatus of FIG. 5, the operation of the feedback loop is modified to allow estimates to be made of the envelope of a modulated high-frequency carrier that is part of signal Ix to be measured. It is not necessary to synchronize the sampling to the carrier signal. This is of particular importance when the modulation signal of signal Ix is asynchronous with respect to the carrier signal of signal Ix, in which case it is impossible to synchronize with both carrier and modulation.

In the signal-measuring apparatus of FIG. 5, the gain of the feedback integrator is made different for positive and negative integration, thereby changing the switching probability at which the loop is balanced. If the switching probability is significantly different from 50%, then the feedback (either the digital output of up/down counter 340 or analog feedback signal $I_B$) is an estimate of a minimum (or maximum) of the signal plus noise. To use this to measure the envelope of a modulated signal, a minimum of two waveform measurements must be made: (1) first, the signal plus noise must be measured with the feedback integrator gain set to estimate the minimum (or maximum) of the waveform as a function of time, and (2) second, the signal is removed and the measurement is repeated—this gives an estimate of the noise in the measurement system. By taking the difference between the foregoing two waveforms, it is possible to estimate the peak values of the modulated waveform as a function of time.

Because it is not practical to balance the feedback loop at 0% or 100% switching probability, the measurement will not be of the actual peaks of the signal, but of a level proportional to the peak of the sinusoidal carrier. This calibration factor can be estimated by measuring, as described above, the level of a constant carrier (i.e., without modulation) and the level of the carrier by independent means such as a broad band power meter.

In the circuit of FIG. 5, the gain is made different for positive and negative integration by gain control 315. An up/down signal from transition detector 50 is applied to the enable input to 4-bit up counter 330, AND logic gate 360, the up/down input to 12-bit up/down counter 340, and the input to inverter 350. A clock signal is applied to 4-bit counter 330 and 12-bit counter 340. The "carry out" output of 4-bit counter 330 is applied to AND gate 360. The output of inverter 350 is applied to OR logic gate 370, and the output from AND gate 360 is applied to OR gate 370. The output from OR gate 370 is applied to the enable input of 12-bit counter 340. The digital output from 12-bit counter 340 is applied to digital-to-analog converter 90.

The 12-bit counter 340 is enabled if (1) the "count down" condition occurs or (2) the "count up" condition occurs and there is a carry from 4-bit counter 330. The 4-bit counter is enabled only if the "count up" condition occurs.

Figure 6:
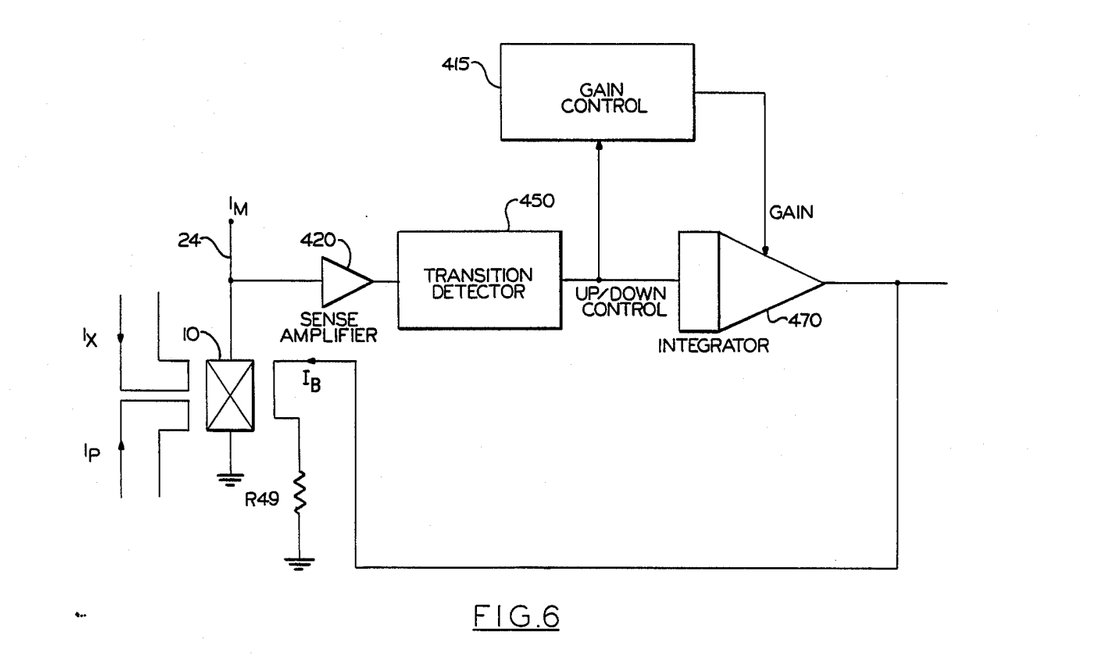
FIG. 6 is a block diagram of an alternative embodiment of a signal-measuring apparatus with variable gain and gain control.

FIG. 6 illustrates an alternative embodiment of the present invention, which involves controlling the gain of an analog integrator. In FIG. 6, the up/down signal generated by sense amplifier 420 and transition detector 450 is applied to analog integrator 470. The output of analog integrator 470 is analog feedback signal $I_B$. Gain control 415 provides an output signal to integrator 470 that makes the gain of integrator 470 different for positive and negative integration.

In the foregoing specification, the invention has been described with reference to specific exemplary embodiments thereof. It will, however, be evident that various modifications and changes may be made thereto without departing from the broader spirit and scope of the invention as set forth in the appended claims. The specification and drawings are, accordingly, to be regarded in an illustrative rather than a restrictive sense.

What is claimed is:

1. An apparatus for measuring an input signal, comprising:
    a monitor gate switchable between at least two distinguishable states, the input signal being applied as a control signal to the monitor gate along with a sampling pulse and an analog bias signal;
    means for generating a detection signal that indicates whether or not the monitor gate has switched between states;
    means for generating a digital output that corresponds to the integration of the detection signal;
    means for converting the digital output of the integration means to the analog bias signal; and
    feedback means for applying the analog bias signal to the monitor gate.

2. The apparatus recited in claim 1 for measuring a signal, wherein the monitor gate is comprised of a Josephson device.

3. The apparatus recited in claim 1 for measuring a signal, wherein the integration means comprises a digital counter.

4. An apparatus for measuring an input signal, comprising:
    a monitor gate switchable between at least two distinguishable states, the input signal being applied as a control signal to the monitor gate along with a sampling pulse and an analog bias signal;
    means for generating a detection signal that indicates which state the monitor gate is in;
    means for generating a digital output that corresponds to the integration of the detection signal;
    means for converting the digital output of the integration means to the analog bias signal; and
    feedback means for applying the analog bias signal to the monitor gate.

5. An apparatus for measuring an input signal, comprising:
    a monitor gate switchable between at least two distinguishable states, the input signal being applied as a control signal to the monitor gate along with a sampling pulse and an analog bias signal;
    means for generating a detection signal that indicates whether or not the monitor gate has switched between states;
    means for generating a digital output that corresponds to the integration of the detection signal, wherein the means for generating a digital output has a gain;
    means for varying the magnitude of the gain of the means for generating a digital output in response to a characteristic of a sequence of detection signals;
    means for converting the digital output of the means for generating a digital output to the analog bias signal; and
    feedback means for applying the analog bias signal to the monitor gate.

6. A probability limit monitor apparatus for an apparatus for measuring an input signal, comprising:
    means for receiving a detection signal that indicates whether or not a monitor gate has switched between states; and
    means for varying the magnitude of a gain of an integrator in response to a characteristic of a sequence of detection signals, the integrator being part of a feedback loop that includes a monitor gate and that provides the monitor gate with an analog bias signal.

7. The probability limit monitor apparatus recited in claim 6, wherein the monitor gate is comprised of a Josephson device.

8. An apparatus for measuring an input signal, comprising:
   a monitor gate switchable between at least two distinguishable states, the input signal being applied as a control signal to the monitor gate along with a sampling pulse and an analog bias signal;
   means for generating detection signals, including a first detection signal that indicates that the monitor gate has switched between states and a second detection signal that indicates that the monitor gate has not switched between states;
   means for generating a digital output that corresponds to the integration of the detection signals including a means for integrating, wherein said means for integrating has a gain;
   means for varying the magnitude of said gain by a first amount in response to a first detection signal and by a second amount in response to a second detection signal;
   means for converting the digital output of said means for integrating to the analog bias signal; and
   feedback means for applying the analog bias signal to the monitor gate.

9. A gain control apparatus for an apparatus for measuring an input signal, comprising:
   means for receiving a first detection signal that indicates that a monitor gate has switched between states and a second detection signal that indicates that the monitor gate has not switched between states, the input signal being applied as a control signal to the monitor gate along with a sampling pulse and an analog bias signal; and
   means for varying a gain of an integrator by a first amount in response to the first detection signal and by a second amount in response to the second detection signal, the integrator being part of a feedback loop that includes the monitor gate and that provides the monitor gate with the analog bias signal.

10. The gain control apparatus recited in claim 9, wherein the monitor gate is comprised of a Josephson device.

11. A method for measuring an input signal, comprising the steps of:
    applying the input signal to a monitor gate along with a sampling pulse and an analog bias signal, the monitor gate being switchable between at least two distinguishable states;
    generating a detection signal that indicates whether or not the monitor gate has switched between states;
    generating a digital output that corresponds to the integration of the detection signal;
    converting the digital output of the integration means to the analog bias signal; and
    applying the analog bias signal from the integration means to the monitor gate.

12. The method recited in claim 11 for measuring a signal, wherein the monitor gate is comprised of a Josephson device.

13. A method for measuring an input signal, comprising the steps of:
    applying the input signal to a monitor gate along with a sampling pulse and an analog bias signal, the monitor gate being switchable between at least two distinguishable states;
    generating a detection signal that indicates whether or not the monitor gate has switched between states;
    generating a digital output that corresponds to the integration of the detection signals using a means for integrating;
    varying the magnitude of the gain of said means for integrating in response to a characteristic of a sequence of detection signals;
    converting the digital output of the means for integrating to the analog bias signal; and
    applying the analog bias signal from the means for integrating to the monitor gate.

14. A method for rapid signal acquisition for an apparatus for measuring a signal, comprising the steps of:
    receiving a detection signal that indicates whether or not a monitor gate has switched between states; and
    varying the magnitude of a gain of an integrator in response to a characteristic of a sequence of detection signals, the integrator being part of a feedback loop that includes the monitor gate and that provides the monitor gate with the analog bias signal.

15. The method for rapid signal acquisition recited in claim 14, wherein the monitor gate is comprised of a Josephson device.

16. A method for measuring an input signal, comprising the steps of:
    applying the input signal to a monitor gate along with a sampling pulse and an analog bias signal, the monitor gate being switchable between at least two distinguishable states;
    generating detection signals, including a first detection signal that indicates that the monitor gate has switched between states and a second detection signal that indicates that the monitor gate has not switched between states;
    generating a digital output that corresponds to the integration of detection signals with a means for integrating, wherein said means for integrating has a gain;
    varying the magnitude of said gain by a first amount in response to a first detection signal and by a second amount in response to a second detection signal;
    converting the digital output of said means for integrating to the analog bias signal; and
    applying the analog bias signal from said means for integrating to the monitor date.

17. A method for gain control for an apparatus for measuring an input signal, comprising:
    receiving a first detection signal that indicates that a monitor gate has switched between states and a second detection signal that indicates that the monitor gate has not switched between states, the input signal being applied as a control signal to the monitor gate along with a sampling pulse and an analog bias signal; and
    varying a gain of an integrator by a first amount in response to the first detection signal and by a second amount in response to the second detection signal, the integrator being part of a feedback loop that includes the monitor gate and that provides the monitor gate with the analog bias signal.

18. The method for gain control recited in claim 17, wherein the monitor gate is comprised of a Josephson junction.

19. A method for estimating an envelope of a high frequency input signal with a signal-measuring apparatus, comprising the steps of:
  applying the input signal to a monitor gate along with a sampling pulse and an analog bias signal, the monitor hate being switchable between at least two distinguishable states;
  generating detection signals, including a first detection signal that indicates that the monitor gate has switched between states and a second detection signal that indicates that the monitor gate has not switched between states;
  generating a digital output that corresponds to the integration of detection signals with a means for integrating, wherein the means for integrating has a gain;
  varying the magnitude of said gain by a first amount in response to a first detection signal and by a second amount in response to a second detection signal;
  converting the digital output of the integration means to the analog bias signal;
  applying the analog bias signal from the integration means to the monitor gate;
  storing the digital output of the integration means as a first measurement;
  removing the input signal from the monitor gate and applying said sampling pulse and said analog bias signal to the monitor gate;
  generating detection signals, including a first detection signal that indicates that the monitor gate has switched between states and a second detection signal that indicates that the monitor gate has not switched between states;
  generating a digital output that corresponds to the integration of detection signals with said means for integrating;
  varying the magnitude of the said gain a first amount in response to a first detection signal and a second amount in response to a second detection signal;
  converting the digital output of said means for integrating to the analog bias signal;
  applying the analog bias signal from the integration means to the monitor gate;
  storing the digital output of the integration means as a second measurement; and
  taking the difference between the first measurement and the second measurement.

* * * * *

UNITED STATES PATENT AND TRADEMARK OFFICE
CERTIFICATE OF CORRECTION

PATENT NO. : 4,823,026

DATED : April 18, 1989

INVENTOR(S) : Eric R. Hanson

It is certified that error appears in the above-identified patent and that said Letters Patent is hereby corrected as shown below:

Column 1, line 35, "grain" should read --gain--.

Column 4, line 45, "to bias" should read --to as bias--.

Column 11, line 10, "hate" should read --gate--.

Column 12, line 16, "of the said" should read --of said--.

Signed and Sealed this

Fifteenth Day of May, 1990

Attest:

HARRY F. MANBECK, JR.

*Attesting Officer*   *Commissioner of Patents and Trademarks*